United States Patent
Chu

(10) Patent No.: US 10,487,550 B2
(45) Date of Patent: Nov. 26, 2019

(54) SUPPORT DEVICE FOR FOLDABLE FLEXIBLE SCREEN AND A DISPLAY DEVICE USING THE SAME

(71) Applicant: BOE TECHNOLOGY GROUP CO., LTD., Beijing (CN)

(72) Inventor: Shangchieh Chu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/778,254

(22) PCT Filed: Jul. 13, 2017

(86) PCT No.: PCT/CN2017/092795
§ 371 (c)(1),
(2) Date: May 23, 2018

(87) PCT Pub. No.: WO2018/082338
PCT Pub. Date: May 11, 2018

(65) Prior Publication Data
US 2018/0347245 A1 Dec. 6, 2018

(30) Foreign Application Priority Data

Nov. 1, 2016 (CN) .................. 2016 2 1209784 U

(51) Int. Cl.
*H05K 5/00* (2006.01)
*E05D 7/00* (2006.01)
(Continued)

(52) U.S. Cl.
CPC ............ *E05D 7/0045* (2013.01); *F16C 11/04* (2013.01); *F16M 11/10* (2013.01); *F16M 11/38* (2013.01);
(Continued)

(58) Field of Classification Search
USPC ................................ 361/755, 807, 809, 810
See application file for complete search history.

(56) References Cited

U.S. PATENT DOCUMENTS 9,173,287 B1  10/2015  Kim et al.
9,603,271 B2   3/2017  Lee et al.
(Continued)

FOREIGN PATENT DOCUMENTS

CN   104900153 A   9/2015
CN   105788457 A   7/2016
(Continued)

OTHER PUBLICATIONS

International Search Report, Form PCT/ISA/210 and Written Opinion for PCT/CN2017/092795, dated Oct. 19, 2017, in Chinese and translated into English.

*Primary Examiner* — Hung S. Bui
(74) *Attorney, Agent, or Firm* — Nath, Goldberg & Meyer; Joshua B. Goldberg; Daniel Bissing

(57) ABSTRACT

A support device for a foldable flexible screen and a display device using the same. The support device includes a first support plate and a second support plate, configured to support and fix a flexible screen; and at least one rotating shaft assembly, configured to connect the first support plate and the second support plate such that the first support plate and the second support plate are able to rotate relative to each other. One of the first support plate and the second support plate is provided with a sliding groove, and one side of the rotating shaft assembly is provided with a rotating shaft; the rotating shaft is slidable and rotatable within the sliding groove; and an extension direction of the sliding groove is not perpendicular to a lengthwise direction of the support plate where the sliding groove is provided.

16 Claims, 5 Drawing Sheets

(51) Int. Cl.
  *H05K 5/02* (2006.01)
  *F16M 11/10* (2006.01)
  *F16C 11/04* (2006.01)
  *G09F 9/30* (2006.01)
  *G06F 1/16* (2006.01)
  *F16M 11/38* (2006.01)
  *F16M 13/00* (2006.01)
  *E05D 3/18* (2006.01)
  *E05D 3/12* (2006.01)

(52) U.S. Cl.
  CPC ............... *F16M 13/00* (2013.01); *G06F 1/16* (2013.01); *G09F 9/30* (2013.01); *H05K 5/0017* (2013.01); *H05K 5/0226* (2013.01); *E05D 3/12* (2013.01); *E05D 3/18* (2013.01); *E05D 7/009* (2013.01); *E05Y 2900/606* (2013.01)

(56) References Cited

U.S. PATENT DOCUMENTS

| | | | |
|---|---|---|---|
| 9,733,744 B2 * | 8/2017 | Lee | G06F 3/0412 |
| 9,801,290 B2 * | 10/2017 | Ahn | H05K 5/0017 |
| 10,100,970 B1 * | 10/2018 | Wu | F16M 13/005 |
| 2012/0044620 A1 | 2/2012 | Song et al. | |
| 2013/0010405 A1 * | 1/2013 | Rothkopf | H04M 1/0216 |
| | | | 361/679.01 |
| 2013/0342090 A1 * | 12/2013 | Ahn | G09F 9/33 |
| | | | 312/258 |
| 2014/0126133 A1 | 5/2014 | Griffin et al. | |
| 2014/0355195 A1 * | 12/2014 | Kee | G06F 1/1616 |
| | | | 361/679.27 |

FOREIGN PATENT DOCUMENTS

| | | |
|---|---|---|
| CN | 206112430 U | 4/2017 |
| EP | 2314053 B1 | 4/2015 |

* cited by examiner

SUPPORT DEVICE FOR FOLDABLE FLEXIBLE SCREEN AND A DISPLAY DEVICE USING THE SAME

CROSS-REFERENCE TO RELATED APPLICATION

This is a National Phase application filed under 35 U.S.C. 371 as a national stage of PCT/CN2017/092795, filed on Jul. 13, 2017, an application claiming the priority of Chinese Patent Application No. 201621209784.X filed on Nov. 1, 2016, titled "A SUPPORT DEVICE FOR FOLDABLE FLEXIBLE SCREEN AND A DISPLAY DEVICE USING THE SAME" in the Chinese Intellectual Property Office, the disclosure of which is incorporated herein by reference.

FIELD OF THE INVENTION

The disclosure relates to the field of display technologies, and in particular, to a support device for foldable flexible screen and a display device using the same.

BACKGROUND OF THE INVENTION

FIGS. 1 to 3 schematically show a folding manner of a current foldable display device. As shown in FIGS. 1 to 3, a flexible screen 12 is fixed on two support plates 11a and 11b. The support plate 11a and the support plate 11b are connected by a rotating shaft 13. In order to achieve the folded and unfolded states, the support plate 11a and the support plate 11b can rotate about the rotating shaft 13.

The inventor has found that the foldable display device in the prior art has at least the following problems.

1. When the support plate 11a and the support plate 11b rotate about the rotating shaft 13, the flexible screen 12 is subjected to a tensile force due to a difference between rotation radius of the support plate 11a and the support plate 11b and the rotation radius of the flexible screen 12.

2. A gap G between the support plate 11a and the support plate 11b is fixed. When the gap G is excessively small, the flexible screen 12 in the folded state is subjected to a relatively large tensile force; and when the gap G is excessively large, the flexible screen 12 in the folded state cannot completely come into contact with the supporting plate 11a and the supporting plate 11b.

3. After the foldable display device has been used for a while, the flexible screen 12 may not be flat in the unfolded state since the gap G between the support plate 11a and the support plate 11b is fixed.

SUMMARY OF THE INVENTION

In view of the problems of the foldable display device in the prior art, the disclosure is to provide a support device for foldable flexible screen that is capable of changing a rotation radius and a display device using the same.

In order to address above problems, the disclosure provides a support device for foldable flexible screen, comprising: a first support plate and a second support plate, configured to support and fix a flexible screen; and at least one rotating shaft assembly, configured to connect the first support plate and the second support plate such that the first support plate and the second support plate are able to rotate relative to each other, wherein one of the first support plate and the second support plate is provided with a sliding groove, and one side of the rotating shaft assembly is provided with a rotating shaft; the rotating shaft is slidable and rotatable within the sliding groove; and an extension direction of the sliding groove is not perpendicular to a lengthwise direction of the support plate where the sliding groove is provided.

Preferably, the rotating shaft assembly further comprises: a first rotating body, located between the first support plate and the second support plate and fixedly connected to the first support plate; a third rotating body, located between the first support plate and the second support plate and fixedly connected to the second support plate; and a second rotating body, configured to connect the first rotating body and a third rotating body such that the first rotating body and the third rotating body are able to rotate with respect to each other, wherein the first rotating body is provided with a first sliding groove and the third rotating body is provided with a second sliding groove; a first rotating shaft and a second rotating shaft are disposed on both ends of the second rotating body, respectively; the first rotating shaft is slidable and rotatable within the first sliding groove and the second rotating shaft is slidable and rotatable within the second sliding groove; and an extension direction of the first sliding groove is not perpendicular to a lengthwise direction of the first support plate where the first sliding groove is provided, and an extension direction of the second sliding groove is not perpendicular to a lengthwise direction of the second support plate where the first sliding groove is provided.

Preferably, the extension direction of the sliding groove is parallel to the lengthwise direction of the support plate where the sliding groove is provided.

Preferably, the extension direction of the first sliding groove is parallel to the lengthwise direction of the first support plate where the first sliding groove is provided and the extension direction of the second sliding groove is parallel to the lengthwise direction of the second support plate where the second sliding groove is provided.

Preferably, surfaces of the first rotating body and the third rotating body used for contacting with the flexible screen are arcuate surfaces.

Preferably, each of arcuate surfaces of the first rotating body and the third rotating body has a radian of 90°, and the arcuate surface of the first rotating body has a radius equal to that of the arcuate surface of the third rotating body.

Preferably, a distance between the first rotating shaft and the flexible screen is equal to a distance between the second rotating shaft and the flexible screen.

Preferably, the first sliding groove has a length equal to that of the second sliding groove.

The disclosure also provides a display device comprising a flexible screen and a support device configured to support and fix the flexible screen.

According to the present disclosure, the second support plate of the support device for foldable flexible screen can move laterally relative to the first support plate to change the relative position between the rotating shaft of the rotating shaft assembly and the second support plate. Further, by changing the relative position between the rotating shaft of the rotating shaft assembly and the second support plate, the rotation radius of the second support plate can be adjusted. In this way, when the first support plate and the second support plate rotate with respect to each other, a tensile force exerted on the flexible screen can be reduced. In the meanwhile, the flexible screen in the folded state can be in complete contact with (closely attached to) the first support plate and the second support plate. In addition, since a gap between the first support plate and the second support plate is adjustable, the flexible screen can be kept flat. The support device for foldable flexible screen according to the present disclosure is applicable to various flexible display devices.

DETAILED DESCRIPTION OF THE EMBODIMENTS

In order to better understand the technical schemes of the disclosure by those skilled in the related art, the disclosure will be further described in conjunction with the accompanying figures and specific embodiments.

Figure 1:
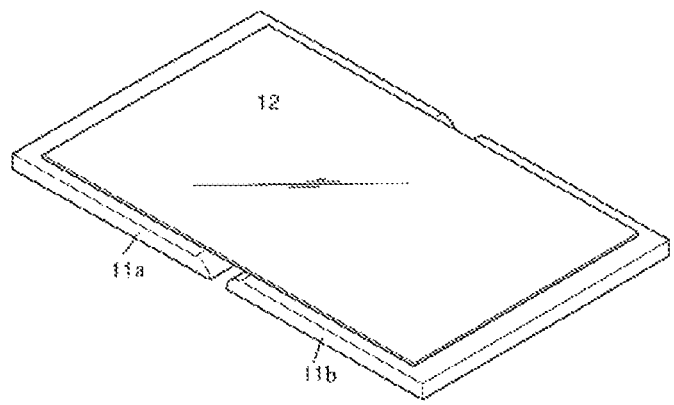
FIGS. 1 to 3 are schematic structural diagrams of a support device for foldable flexible screen in the prior art.
Figure 2:
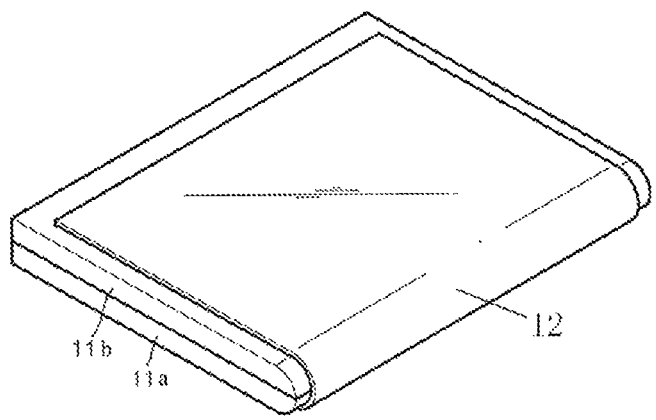
Figure 3:
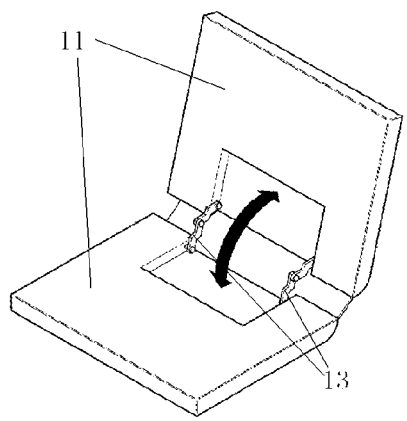
Figure 4A:
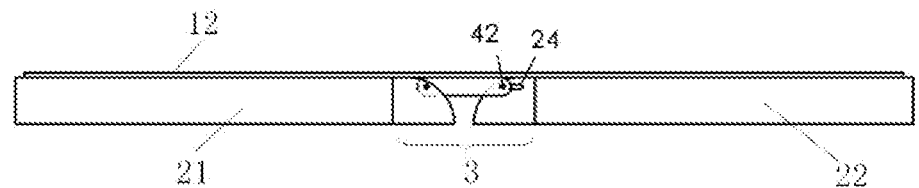
FIG. 4a is a schematic structural diagram of a support device for foldable flexible screen in an unfolded state according to an embodiment of the disclosure.

FIG. 4a is a schematic structural diagram of a support device for foldable flexible screen in an unfolded state according to an embodiment of the disclosure. In this embodiment, there is provided a support device for foldable flexible screen. As shown in FIG. 4a, the support device for foldable flexible screen includes a first support plate 21 and a second support plate 22 that are configured to support and fix a flexible screen 12; and at least one rotating shaft assembly 3 configured to connect the first support plate 21 and the second support plate 22 such that the first support plate 21 and the second support plate 22 are able to rotate relative to each other, wherein one of the first support plate 21 and the second support plate 22 (the second support plate 22 in FIG. 4a) is provided with a sliding groove 24, and one side of the rotating shaft assembly 3 is provided with a rotating shaft 42; the rotating shaft 42 is slidable and rotatable within the sliding groove 24; and an extension direction of the sliding groove 24 is parallel to a lengthwise direction of the support plate where the rotating shaft 42 is provided.

According to this embodiment, the second support plate 22 of the support device for foldable flexible screen can move laterally relative to the first support plate 21 to change the relative position between the rotating shaft 42 of the rotating shaft assembly 3 and the second support plate 22. Further, by changing the relative position between the rotating shaft 42 of the rotating shaft assembly 3 and the second support plate 22, the rotation radius of the second support plate 22 can be adjusted. In this way, when the first support plate 21 and the second support plate 22 rotate with respect to each other, a tensile force exerted on the flexible screen 12 can be reduced. In the meanwhile the flexible screen 12 in the folded state can be in complete contact with (closely attached to) the first support plate 21 and the second support plate 22. In addition, since a gap between the first support plate 21 and the second support plate 22 is adjustable, the flexible screen 12 can be kept flat. The support device for foldable flexible screen 12 according to the present disclosure is applicable to various flexible display devices.

It is readily understood that the sliding groove may be disposed on the first support plate 21 such that the first support plate 21 can move laterally relative to the second support plate 22.

Figure 4B:
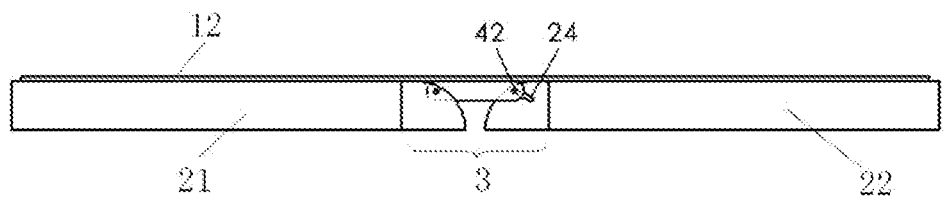
FIG. 4b is a schematic structural diagram of a support device for foldable flexible screen in an unfolded state according to an embodiment of the disclosure.
Figure 5:
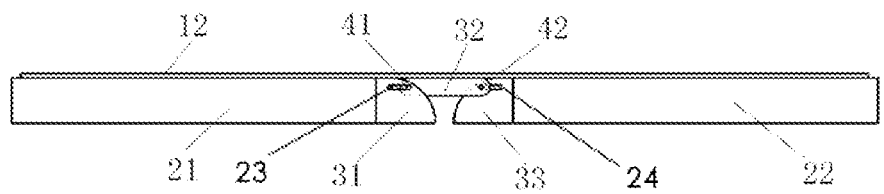
FIG. 5 is a schematic structural diagram of a support device for foldable flexible screen in an unfolded state according to an embodiment of the disclosure.

FIG. 4b is a schematic structural diagram of a support device for foldable flexible screen in an unfolded state according to an embodiment of the disclosure. Different from the above-described embodiment, the extension direction of the sliding groove 24 is inclined with respect to the lengthwise direction of the support plate where the sliding groove is provided.

It would be readily understood that, as long as the sliding groove 24 has a component extending along the length of the support plate where the sliding groove is provided, the first support plate 21 and/or the second support plate 22 can laterally move to change the radius of rotation of the first support plate 21 and/or the second support plate 22. In other words, the extension direction of the sliding groove 24 is not allowed to be perpendicular to the lengthwise direction of the support plate where the sliding groove is provided.

FIGS. 5 to 8 illustrate a support device for foldable flexible screen according to an embodiment of the present disclosure. Compared with the above-described embodiments, the rotating shaft assembly 3 in the support device for foldable flexible screen according to this embodiment further comprises: a first rotating body 31 located between the first support plate 21 and the second support plate 22 and fixedly connected to the first support plate 21; a third rotating body 33 located between the first support plate 21 and the second support plate 22 and fixedly connected to the second support plates 22; and a second rotating body 32 configured to connect the first rotating body 31 and the third rotating body 33 and rotate the first rotating body 31 and the third rotating body 33 with respect to each other, wherein the first rotating body 31 is provided with a first sliding groove 23, and the third rotating body 33 is provided with a second sliding groove 24; a first rotating shaft 41 and a second rotating shaft 42 are disposed on both ends of the second rotating body 32, respectively; the first rotating shaft 41 is slidable and rotatable within the first sliding groove 23, and the second rotating shaft 42 is slidable and rotatable within the second sliding groove 24; and an extension direction of the first sliding groove 23 is not perpendicular to a lengthwise direction of the first support plate where the first sliding groove is provided and an extension direction of the second sliding groove 24 is not perpendicular to a lengthwise direction of the second support plate where the second sliding groove is provided. Preferably, the extension direction of the first sliding groove 23 is parallel to the lengthwise direction of the first support plate where the first sliding groove is provided and the extension direction of the second sliding groove 24 is parallel to the lengthwise direction of the second support plate where the second sliding groove is provided.

According to this embodiment, the flexible screen 12 is fixed to the first support plate 21 and the second support plate 22 rather than the rotating shaft assembly 3 (including the first rotating body 31, the second rotating body 32 and the third rotating body 33) between the first support plate 21 and the second support plate 22. In this manner, during the folding process, the first rotating shaft 41 and the second rotating shaft 42 can slide and rotate in the first sliding groove 23 and the second sliding groove 24, respectively, so as to change the rotation radius of the first support plate 21 and the second support plate 22. In this way, when the first support plate 21 and the second support plate 22 relatively rotate, the tensile force exerted on the flexible screen 12 can be reduced, while the flexible screen 12 in the folded state can be in complete contact with (closely attached to) the first support plate 21 and the second support plate 22. In addition, since the gap between the first support plate 21 and the second support plate 22 is adjustable, the flexible screen 12 can be kept flat.

Figure 6:
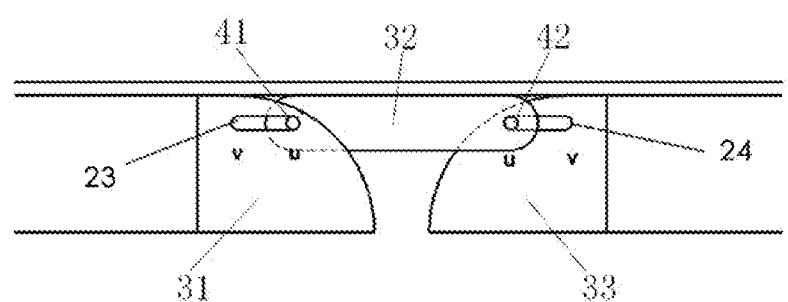
FIG. 6 is a partially enlarged view of a rotating shaft assembly in the support device for foldable flexible screen as shown in FIG. 5.
Figure 7:
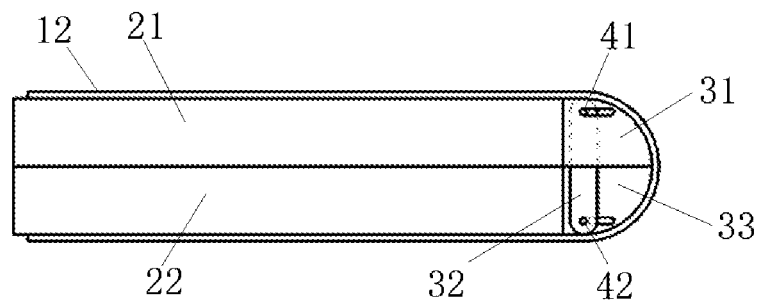
FIG. 7 is a schematic structural diagram of the support device for foldable flexible screen in a folded state according to the embodiment of the disclosure.

In other words, although the rotation radius of the first support plate 21 and the second support plate 22 during the folding or unfolding process is different from the rotation radius of the flexible screen 12, by changing the positions of the first rotating shaft 41 and the second rotating shaft 42 with respect to the first support plate 21 and the second support plate 22, the rotation radiuses of the first support plate 21 and the second support plate 22 can be adjusted. Specifically, when the support device is folded, as shown in FIGS. 6 and 7, the first rotating shaft 41 and the second rotating shaft 42 move from a first position u to a second position v. In the meantime, the first support plate 21 and the second support plate 22 become close to each other and rotate relative to each other. In the end, the support device reaches the folded state as shown in FIG. 7.

Preferably, as shown in FIG. 6, surfaces of the first rotating body 31 and the third rotating body 33 used for contacting with the flexible screen 12 are arcuate surfaces. In this way, during the folding or unfolding of the flexible screen 12, the friction between the first and third rotating bodies 31, 33 and the flexible screen 12 can be reduced without any damage to the flexible screen 12.

Figure 9:
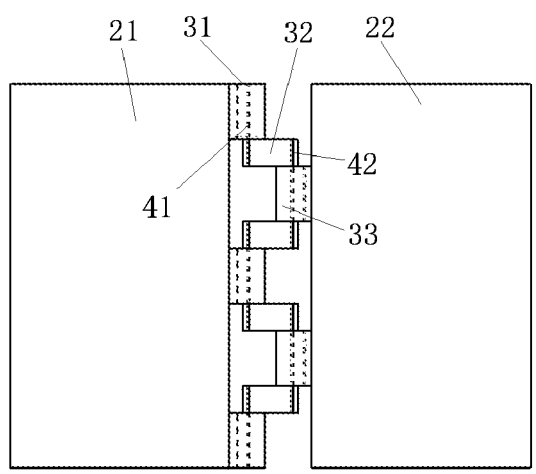
FIG. 9 is a schematic structural diagram of a support device for foldable flexible screen in an unfolded state according to an embodiment of the disclosure.
Figure 10:
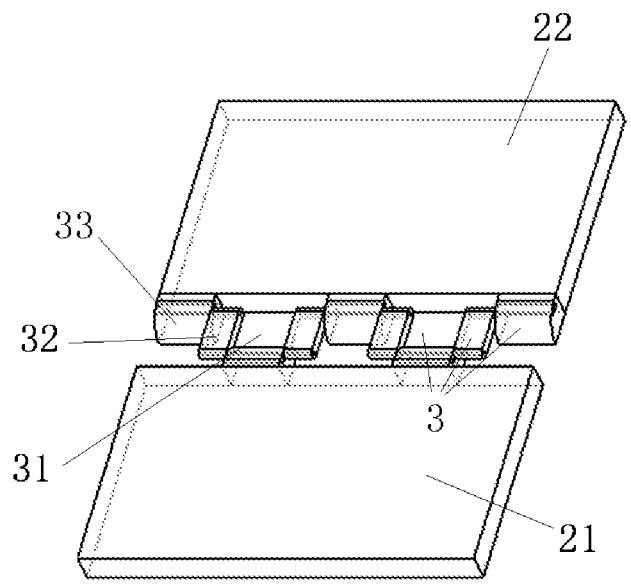
FIG. 10 is a perspective view of the support device for foldable flexible screen in the unfolded state according to the embodiment of the disclosure.
Figure 11:
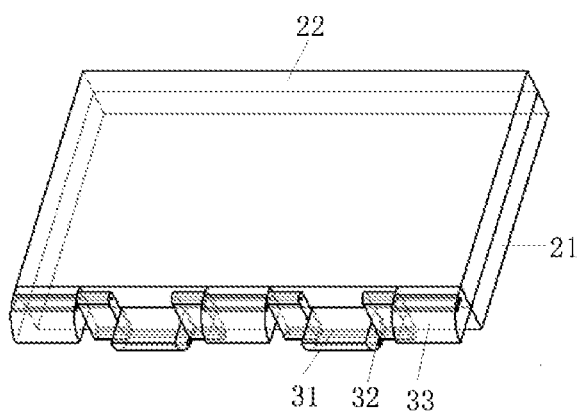
FIG. 11 is a perspective view of the support device for foldable flexible screen in a folded state according to the embodiment of the disclosure.

FIGS. 9 to 11 illustrate a support device for foldable flexible screen according to an embodiment of the disclosure. Different from the above-described embodiment, a plurality of sets of rotating shaft assemblies 3 are employed in the support device for foldable flexible screen according to the embodiment.

Figure 8:
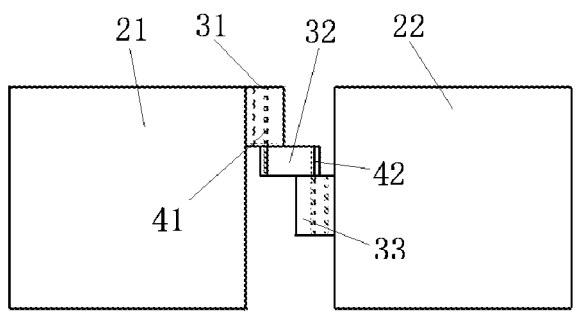
FIG. 8 is a schematic top plan view of the support device for foldable flexible screen in a folded state according to the embodiment of the disclosure.

It should be noted that when the flexible screen 12 has a relatively small area, only one rotating shaft assembly 3 may be used between the first support plate 21 and the second support plate 22, as shown in FIG. 8. When the flexible screen 12 has a relatively large area, a plurality of sets of the rotating shaft assemblies 3 can be used between the first support plate 21 and the second support plate 22, as shown in FIGS. 8 to 11. It can be understood that lengths of the first rotating body 31 and the third rotating body 33 and positions thereof relative to the second rotating body 32 can be adjusted as required.

Figure 12:
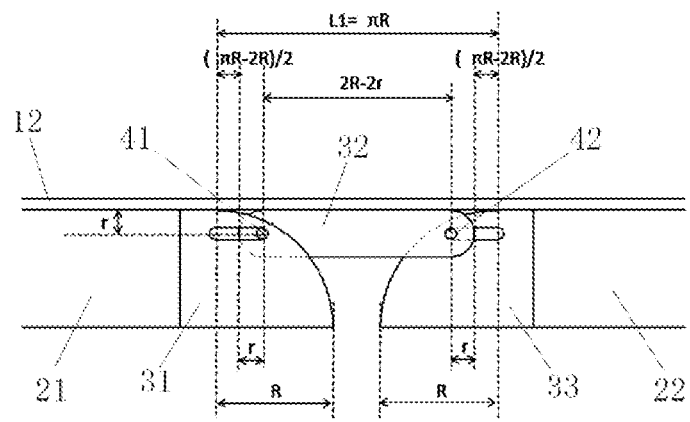
FIG. 12 is a partially enlarged view of a rotating shaft assembly in the support device for foldable flexible screen in the unfolded state according to the embodiments of the disclosure.
Figure 13:
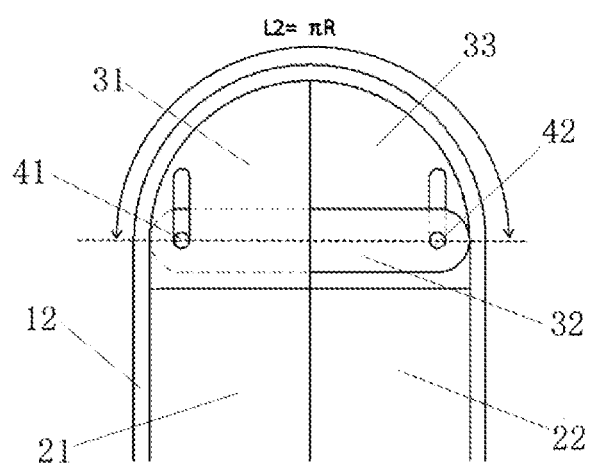
FIG. 13 is a partially enlarged view of the rotating shaft assembly in the support device for foldable flexible screen in the folded state according to the embodiments of the disclosure.

Preferably, as shown in FIGS. 12 and 13, each of arcuate surfaces of the first rotating body 31 and the third rotating body 33 has a radian of 90°, and the arcuate surface of the first rotating body 31 has a radius equal to that of the arcuate surface of the third rotating body 33.

Preferably, a distance between the first rotating shaft 41 and the flexible screen 12 is equal to a distance between the second rotating shaft 42 and the flexible screen 12.

As shown in FIG. 13, the second rotating body 32 has a length less than or equal to the radius R of the arcuate surface of the first rotating body 31 or the third rotating body 33.

Preferably, the first sliding groove 23 has a length equal to that of the second sliding groove 24.

As shown in FIG. 13, the distance between the first rotating shaft 41 and the second rotating shaft 42 is 2R-2r, where R is the radius R of the arcuate surface of the first rotor 31 or the third rotating body 33, and r is the distance between the first rotating shaft 41 or the second rotating shaft 42 and the flexible screen 12.

In another aspect, the present disclosure also provides a display device including a flexible screen and a support device configured to support and fix the flexible screen. The display device may be any product or component having a display function, such as an electronic paper, an OLED panel, a mobile phone, a tablet computer, a television, a display, a notebook computer, a digital photo frame, a navigator and the like.

Obviously, many variations may be made to the specific examples of the above embodiments. For example, the positions or the specific sizes of the first rotating body and the third rotating body relative to the second rotating body can be adjusted as required, and the size of the first rotating shaft or the second rotating shaft can be changed according to an actual situation.

It can be understood that the above embodiments are merely exemplary embodiments provided for illustrating the principle of the present disclosure. However, the disclosure is not limited thereto. For those persons having ordinary skills in the art, various modifications and improvements may be made without departing from the spirit and essence of the present disclosure. These variations and improvements are also considered as the protection scope of the present disclosure.

The invention claimed is:

1. A support device for foldable flexible screen, comprising:
    a first support plate and a second support plate, configured to support and fix a flexible screen; and
    at least one rotating shaft assembly, configured to connect the first support plate and the second support plate such that the first support plate and the second support plate are able to rotate relative to each other,
    wherein one of the first support plate and the second support plate is provided with a sliding groove, and one side of the rotating shaft assembly is provided with a rotating shaft;
    the rotating shaft assembly further includes: a first rotating body located between the first support plate and the second support plate and fixedly connected to the first support plate; a third rotating body, located between the first support plate and the second support plate and fixedly connected to the second support plate; and a second rotating body, configured to connect the first rotating body and third rotating body such that the first rotating body and the third rotating body are able to rotate with respect to each other;

the rotating shaft is slidable and rotatable within the sliding groove, such that the second support plate is movable laterally with respect to the first support plate; and an extension direction of the sliding groove is not perpendicular to a lengthwise direction of the one of the first support plate and the second support plate where the sliding groove is provided.

2. The support device for foldable flexible screen according to claim 1, wherein the first rotating body is provided with a first sliding groove and the third rotating body is provided with a second sliding groove;

a first rotating shaft and a second rotating shaft are disposed on both ends of the second rotating body, respectively;

the first rotating shaft is slidable and rotatable within the first sliding groove and the second rotating shaft is slidable and rotatable within the second sliding groove; and an extension direction of the first sliding groove is not perpendicular to a lengthwise direction of the first support plate where the first sliding groove is provided, and an extension direction of the second sliding groove is not perpendicular to a lengthwise direction of the second support plate where the first sliding groove is provided.

3. The support device for foldable flexible screen according to claim 2, wherein the extension direction of the first sliding groove is parallel to the lengthwise direction of the first support plate where the first sliding groove is provided and the extension direction of the second sliding groove is parallel to the lengthwise direction of the second support plate where the second sliding groove is provided.

4. The support device for foldable flexible screen according to claim 2, wherein surfaces of the first rotating body and the third rotating body used for contacting with the flexible screen are arcuate surfaces.

5. The foldable flexible screen support device according to claim 4, wherein each of arcuate surfaces of the first rotating body and the third rotating body has a radian of 90°, and the arcuate surface of the first rotating body has a radius equal to that of the arcuate surface of the third rotating body.

6. The foldable flexible screen support device according to claim 5, wherein a distance between the first rotating shaft and the flexible screen is equal to a distance between the second rotating shaft and the flexible screen.

7. The support device for foldable flexible screen according to claim 5, wherein the first sliding groove has a length equal to that of the second sliding groove.

8. The support device for foldable flexible screen according to claim 1, wherein the extension direction of the sliding groove is parallel to the lengthwise direction of the one of the first support plate and the second support plate where the sliding groove is provided.

9. A display device comprising a flexible screen and a support device configured to support and fix the flexible screen, wherein the support device is the support device for foldable flexible screen according to claim 1.

10. The display device according to claim 9, wherein the first rotating body is provided with a first sliding groove and the third rotating body is provided with a second sliding groove;

a first rotating shaft and a second rotating shaft are disposed on both ends of the second rotating body, respectively;

the first rotating shaft is slidable and rotatable within the first sliding groove and the second rotating shaft is slidable and rotatable within the second sliding groove; and an extension direction of the first sliding groove is not perpendicular to a lengthwise direction of the first support plate where the first sliding groove is provided, and an extension direction of the second sliding groove is not perpendicular to a lengthwise direction of the second support plate where the first sliding groove is provided.

11. The display device according to claim 9, wherein the extension direction of the sliding groove is parallel to the lengthwise direction of the one of the first support plate and the second support plate where the sliding groove is provided.

12. The display device according to claim 10, wherein the extension direction of the first sliding groove is parallel to the lengthwise direction of the first support plate where the first sliding groove is provided and the extension direction of the second sliding groove is parallel to the lengthwise direction of the second support plate where the second sliding groove is provided.

13. The display device according to claim 10, wherein surfaces of the first rotating body and the third rotating body used for contacting with the flexible screen are arcuate surfaces.

14. The display device according to claim 13, wherein each of arcuate surfaces of the first rotating body and the third rotating body has a radian of 90°, and the arcuate surface of the first rotating body has a radius equal to that of the arcuate surface of the third rotating body.

15. The display device according to claim 14, wherein a distance between the first rotating shaft and the flexible screen is equal to a distance between the second rotating shaft and the flexible screen.

16. The display device according to claim 14, wherein the first sliding groove has a length equal to that of the second sliding groove.

\* \* \* \* \*